(12) United States Patent
Shen et al.

(10) Patent No.: US 10,153,758 B2
(45) Date of Patent: Dec. 11, 2018

(54) EFFICIENT DIGITAL DUTY CYCLE ADJUSTERS

(71) Applicant: SK hynix Inc., Gyeonggi-do OT (KR)

(72) Inventors: Chun-Ju Shen, San Jose, CA (US); Jenn-Gang Chern, Redwood City, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/482,553

(22) Filed: Apr. 7, 2017

(65) Prior Publication Data

US 2017/0310316 A1 Oct. 26, 2017

Related U.S. Application Data

(60) Provisional application No. 62/325,298, filed on Apr. 20, 2016.

(51) Int. Cl.
| | |
|---|---|
| *H03K 7/08* | (2006.01) |
| *H03K 5/156* | (2006.01) |
| *H03K 5/135* | (2006.01) |
| *H03K 5/00* | (2006.01) |

(52) U.S. Cl.
CPC ............. *H03K 7/08* (2013.01); *H03K 5/135* (2013.01); *H03K 5/1565* (2013.01); *H03K 2005/00052* (2013.01); *H03K 2005/00058* (2013.01)

(58) Field of Classification Search
CPC .......... H03K 7/08; H03K 3/015; H03K 3/017; H03K 5/135; H03K 5/1565

USPC ......................................................... 327/175
See application file for complete search history.

(56) References Cited

U.S. PATENT DOCUMENTS

| | | | |
|---|---|---|---|
| 7,298,193 B2 | 11/2007 | Agarwal et al. | |
| 7,701,273 B2* | 4/2010 | Choi .................... | H03K 5/1565 327/158 |
| 7,705,647 B2 | 4/2010 | Dai et al. | |
| 2005/0024107 A1* | 2/2005 | Takai ..................... | H03K 5/133 327/158 |
| 2007/0194824 A1* | 8/2007 | Kumata ............... | G11C 7/1066 327/158 |
| 2014/0266361 A1* | 9/2014 | Shashidharan ...... | H03K 5/1565 327/175 |
| 2016/0013785 A1* | 1/2016 | Nakata ................. | H03K 5/1565 327/175 |

\* cited by examiner

*Primary Examiner* — Ryan Jager
(74) *Attorney, Agent, or Firm* — IP & T Group LLP

(57) ABSTRACT

The embodiments of the present invention provide an apparatus of an efficient digital duty cycle adjuster and the method of operation thereof. The method includes: providing an input clock having an input clock duty cycle; inserting at least one programmable delay of a programmable delay line to the input clock, the input clock has a first delay inserted for a delayed rise edge, and a second delay inserted for a delayed fall edge, wherein the first delay, the second delay, or the combination thereof, includes the programmable delay; and adjusting an output clock duty cycle of an output clock by configuring the programmable delay, the output clock is generated by a selecting circuit, the selecting circuit includes a select signal, and the select signal is determined in accordance with the first delay and the second delay.

18 Claims, 17 Drawing Sheets

EFFICIENT DIGITAL DUTY CYCLE ADJUSTERS

CROSS-REFERENCES TO RELATED APPLICATIONS

This application claims the benefit of U.S. Provisional Application No. 62/325,298 filed Apr. 20, 2016, the entire contents of which are incorporated herein by reference.

BACKGROUND

Field of Invention

The exemplary embodiments of the present invention relate to an apparatus of integrated circuit clocks, and more particularly to efficient digital duty cycle adjusters and the method of operation thereof.

Description of Related Arts

A clock duty cycle is the percentage of the region when the clock is high in one clock period. Clocks with 50% duty cycle is critical for the high speed integrated circuit, especially when the circuit's timing margin depends on both the rise edges and fall edges of the clock. One example is a double-data rate (DDR) input/output (I/O) interface where both the rise edges and fall edges are used to sample the data. The DDR I/O interface may be used in, for example, a synchronous semiconductor device including a double-data rate (DDR) synchronous dynamic random access memory, DDR-3 dynamic random access memory, and the like in order to transfer data from/to external devices using an internal clock, which is synchronized with an external clock inputted from an external device, for example, a memory controller. Another example is the dynamic circuit, in which the duty cycle allocates the time for the pre-charge and evaluation phases.

Duty cycle distortion can be caused by the imbalanced circuits, imbalanced routings, and process-voltage-temperature (PVT) variations. Long distance and complex clock distribution network only add more uncertainties into the duty cycle. To mitigate the problems, it is desired to correct the duty cycle before the clock is fed into the high-performance circuit blocks.

The general duty cycle corrector contains a duty cycle detector and a duty cycle adjuster. The duty cycle detector detects the duty cycle of the input clock and sends out the information to the duty cycle adjuster. Bases on the information, the duty cycle adjuster adjusts the duty cycle of the output clock until it approaches 50%. This disclosure focuses on the duty cycle adjuster.

The duty cycle adjustment can be done mainly in two ways. One is to adjust the pull-up strength of the clock buffer relative to its pull-down strength, and vice versa. This is usually done by purposely weakening the drive strength in one direction. However, the slow transition edge it creates is sensitive to environmental noises. Furthermore, if the edge is too slow to be completed in half a cycle, the clock quality is degraded. This situation sets the limit for how much duty cycle correction can be done. From simulations, it is hard to achieve ±10% duty cycle adjustment across PVT corners with the 1$^{st}$ method being applied. The 2$^{nd}$ method is to shift the rise or fall edges directly in the time domain through the programmable delay lines. This method theoretically, with a proper design, has no limitation since the programmable delay is unbounded.

Both methods can be implemented in analog and digital circuits. The clock distribution network crosses a big area of the chip, and in most places, only the digital core supply is available. As the core supply goes lower, digital circuits are more favorable.

The conventional digital duty cycle adjuster is shown in FIG. 1. The circuit passes the rise edge of CKI to node X by turning on the PMOS transistor stack for a short duration (3 inverter delay) of time and latching the logic one in the feedback circuit (i.e. a latch). The same rise edge of CKI is also delayed by a programmable delay Th and passed to node X by turning on the NMOS transistor stack for a short duration of time. The logic zero is then latched to the feedback circuit. The fall edge and thus the duty cycle of CKO can be adjusted by programming the delay Th. To obtain 50% duty cycle at CKO, Th needs to be programmed to T/2, where T is the clock period. The drawback of this circuit is that the delay line covers ~T/2 delay even if only a small duty cycle distortion (e.g. ±3% of T) needs to be corrected. (Reference: K. Agarwal; R. Montoye; "A Duty-Cycle Correction Circuit for High-Frequency Clocks", *VLSI Circuits*, 2006.)

Whenever the duty cycle adjuster is required to support a wide clock frequency range, the tradeoff of resolution and correction range becomes an issue. There exists a need for an improved duty cycle adjuster.

SUMMARY OF THE INVENTION

An apparatus of an efficient digital duty cycle adjuster comprising: an input clock having an input clock duty cycle; at least one programmable delay line inserting a programmable delay to the input clock, the input clock has a first delay inserted for a delayed rise edge, and a second delay inserted for a delayed fall edge, wherein the first delay, the second delay, or the combination thereof, includes the programmable delay; and a selecting circuit generating an output clock having an output clock duty cycle, the selecting circuit includes a select signal, the select signal is determined in accordance with the first delay and the second delay, the output clock duty cycle is adjusted by the programmable delay.

A method of operation of an efficient digital duty cycle adjuster comprising: providing an input clock having an input clock duty cycle; inserting at least one programmable delay of a programmable delay line to the input clock, the input clock has a first delay inserted for a delayed rise edge, and a second delay inserted for a delayed fall edge, wherein the first delay, the second delay, or the combination thereof, includes the programmable delay; and adjusting an output clock duty cycle of an output clock by configuring the programmable delay, the output clock is generated by a selecting circuit, the selecting circuit includes a select signal, and the select signal is determined in accordance with the first delay and the second delay.

Certain embodiments of the invention have other aspects in addition to or in place of those mentioned or obvious from the above. The aspects will become apparent to those skilled in the art from a reading of the following detailed description when taken with reference to the accompanying drawings.

DETAILED DESCRIPTION OF THE INVENTION

Figure 1:
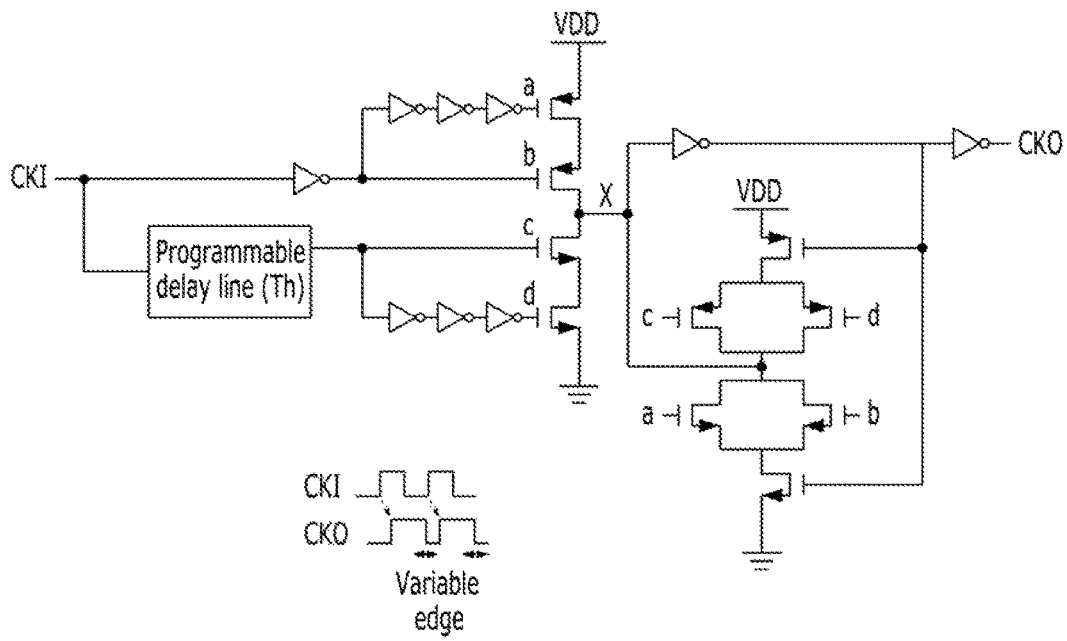
FIG. 1 is a schematic of a conventional digital duty cycle adjuster.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents.

Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

While specific embodiments are described below with reference to particular switches, circuits or logic configurations, those of skill in the art can realize that the embodiments of the present invention may advantageously be implemented with other substantially equivalent configurations. It is to be understood that other embodiments would be evident based on the present disclosure, and that system, process, or mechanical changes may be made without departing from the scope of the present invention.

In order to avoid obscuring the present invention, some well-known circuits, system configurations, and process steps are not disclosed in detail. The switches, circuits or logic configurations may be fabricated with various IC process technologies, such as complementary metal oxide semiconductor (CMOS).

Likewise, the drawings showing embodiments of the system are semi-diagrammatic and not to scale and, particularly, some of the dimensions are for the clarity of presentation and are shown greatly exaggerated in the drawing FIGS. The depictions in the FIGS. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

To adjust the clock duty cycle, the prior art adjusts only the fall edges. With only one degree of freedom, to make a 50% duty cycle at the output, the delay line needs to be programmed to 0.5T delay (T is the clock period). For example, even if only 3% of duty cycle distortion needs correction, the programmable delay line still corrects 0.5T, which is a big waste.

Here we disclosed several digital duty cycle adjusters where the programmable delay lines are fully utilized to compensate only the "distortion" part, resulting in designs with smaller area, less clock jitter, and shorter settling (or calibration) time when put into a complete duty cycle correction loop.

First, we propose a three-delay-line version and a two-delay-line version with an equivalent principle. The idea is to adjust both rise and fall edges. With two degrees of freedom, the delay lines only need to be programmed up to $\alpha T$ delay, where $\alpha$ is the duty cycle correction range and T is the clock period. For example, $\alpha=0.03$ if we plan to correct ±3% duty cycle distortion.

Second, if we have the prior knowledge provided by the duty cycle detector, which is always available in the duty cycle correction circuit, whether the input duty cycle is below or above 50%, the two degrees of freedom requirement can be degenerated to one degree of freedom, and we can further simplify the design to a one-delay-line version.

All the proposed designs above can function correctly only when the logic highs of the internal clocks have overlapped regions. Thus, the input clock duty cycle should not be less than 25%. To extend the acceptable input clock duty cycle condition to the theoretical limit ~0%, we further propose a one-delay-line versions which rely on edge triggers rather than the overlapped logic ones of internal clocks. Thus, we achieve designs without being limited by the input clock duty cycle.

It is our interest to know how efficient our designs are when comparing to the prior art. The area is proportional to the delay of the programmable delay lines with a given time resolution. Compared to the prior art, our delay lines' area is $0.5/N\alpha$ times smaller, where $\alpha$ is the duty cycle correction range and N is the number of programmable delay lines.

When our designs are employed by the entire duty cycle correction loop, including detector and adjuster, the loop settling time is also proportional to the delay under the same time resolution. Thus, the loop settling time is also $0.5/N\alpha$ times shorter with our disclosed solutions.

In addition, under a noisy power supply, the clock jitter is proportional to the propagation delay. Since our designs use much shorter delay lines, the output of the duty cycle adjuster has less jitters.

First, we disclose two duty cycle adjusters which are fundamentally equivalent. One duty cycle adjuster may use three programmable delay lines as exemplarily shown in FIG. 2 while the other duty cycle adjuster may use two programmable delay lines as exemplarily shown in FIG. 3.

The basic principle of the two duty cycle adjusters is to use a programmable delay line Tr to adjust the rise edge of CKO, and use a programmable delay line Tf to adjust the fall edge of CKO. A dynamic mux with a proper select signal CKD chooses the CKR path for generating the rise edge of CKO, and chooses the CKF path for generating the fall edge of CKO.

Figure 2:
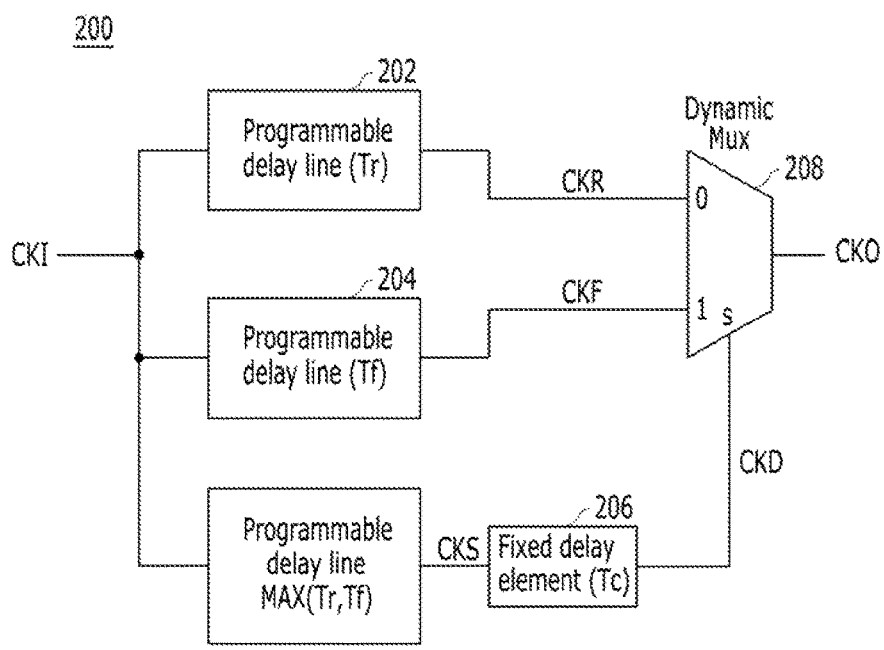
FIG. 2 is a schematic of a three-delay-line duty cycle adjuster in accordance with an embodiment of the present invention.

FIG. 2 is the schematic of a three-delay-line duty cycle adjuster 200 in accordance with an embodiment of the present invention. The three-delay-line duty cycle adjuster 200 can have a programmable delay line Tr 202, a programmable delay line Tf 204, a programmable delay line MAX, a fixed delay Tc 206, and a selecting circuit, such as a dynamic mux 208.

The programmable delay line Tr 202 can have an input CKI, an output CKR, and a first delay, such as a delay of Tr. The programmable delay line Tf 204 can have the input CKI, an output CKF, and a second delay, such as a delay of Tf. The programmable delay line MAX can have the input CKI, an output CKS, and a delay of MAX(Tr, Tf), wherein the delay of MAX(Tr, Tf) is the greater value of the delay of Tr and Tf. If Tr is greater than Tf (Tr>Tf), MAX(Tr, Tf) can equal Tr and thus CKS can equal CKR. If Tr is less than Tf (Tr<Tf), MAX(Tr, Tf) can equal Tf and thus CKS can equal CKF. The programmable delay line Tr 202 and programmable delay line Tf 204 can be programmable up to $\alpha T$ delay, where $\alpha$ is the duty cycle correction range and T is the clock period. The delay of Tr and Tf can be configured in accordance with the duty cycle distortions detected by the duty cycle detector.

For example, if we plan to correct ±3% duty cycle distortion, $\alpha$ can be set to 0.03. The programmable delay line Tr 202 or programmable delay line Tf 204 can be programmed, such that the delay of Tr and Tf can be equal to 0.03T. The delay of Tr and Tf can be programmed to different values if it is necessary. In a real case scenario, when the duty cycle distortion is +3%, the duty cycle is 53%, the programmable delay line Tr 202 can be programmed to (0.03T+Ti), while the programmable delay line Tf 204 can be equal to Ti, to compensate the duty cycle to 50%. When the duty cycle distortion is −3%, the duty cycle is 47%, the programmable delay line Tf 204 can be programmed to (0.03T+Ti), while the programmable delay line Tr 202 can be equal to Ti, to compensate the duty cycle to 50%. Wherein Ti is the intrinsic delay of the programmable delay lines 302 and 304 identically. When Ti is small enough to omitted, the programmable delay line Tr 202 can be programmed to 0.03T while the programmable delay line Tf 204 can be equal to 0, for the +3% duty cycle distortion. For the −3% duty cycle distortion, the programmable delay line Tf 204 can be programmed to 0.03T, while the programmable delay line Tr 202 can be equal to 0.

The output CKS can be further delayed by the fixed delay Tc 206 to generate a select signal CKD, wherein the select signal CKD can control the dynamic mux 208 to dynamically select either a delayed rise edge, such as the CKR, or a delayed fall edge, such as the CKF, as the output CKO. The output CKO can equal to the CKF when the select signal CKD is 1, and equal to the CKR when the select signal CKD is 0. The fixed delay Tc 206 can provide a safe timing margin such that, when the select signal "s" of the dynamic mux 208 switches, the inputs CKR and CKF thereof are always valid signals.

In the three-delay-line duty cycle adjuster 200, only the programmable delay line Tr 202 and the programmable delay line Tf 204 are utilized for adjusting the duty cycle of CKO. The programmable delay line MAX only provide the properly timed select signal CKD to control the dynamic mux 208 without introducing any timing violation.

It has been discovered that, the three-delay-line duty cycle adjuster disclosed in the embodiment of the present invention, has programmable delay line can be adjusted for supplement of various delay in accordance with the duty cycle distortion, to minimize the programmable delay line necessary for adjusting the duty cycle. Therefore, a shorter programmable delay line can result in smaller circuit area, less jitters, and shorter settling time, for a more reliable circuitry and better performance. The smaller circuit area can also be more flexible for physical design, such as shorter routing and more placing options, which may contribute to performance improvement.

Figure 3:
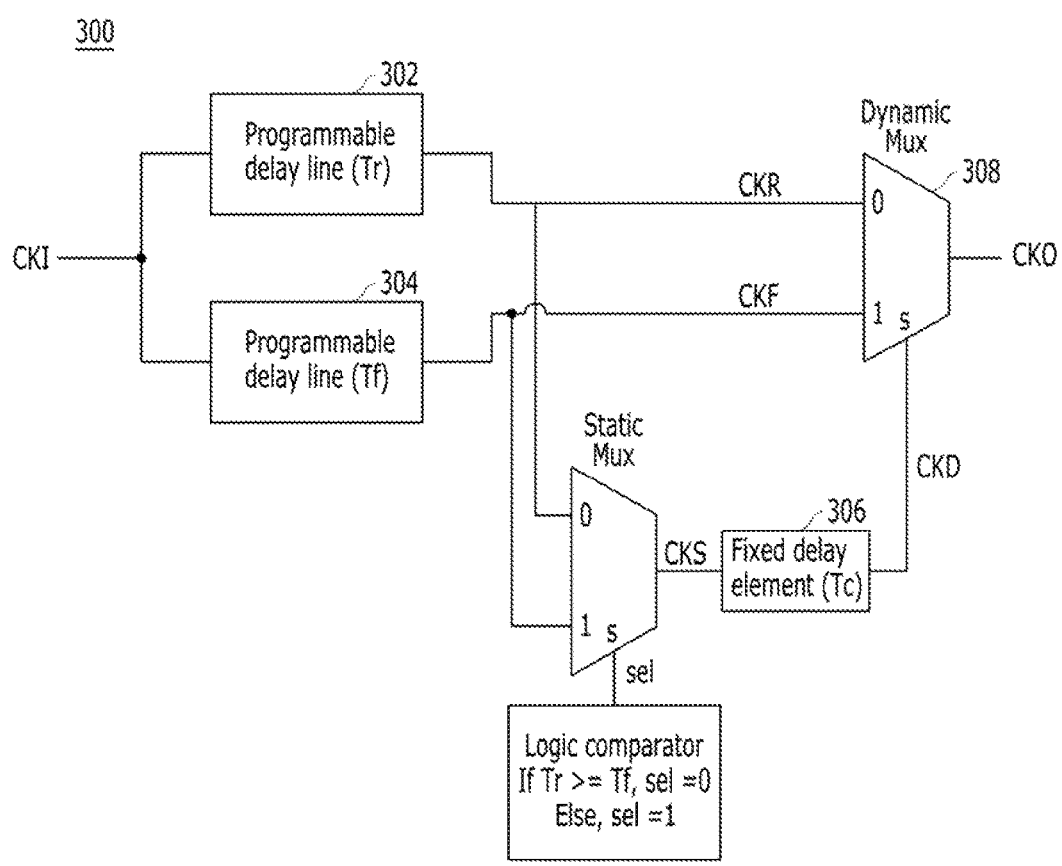
FIG. 3 is a schematic of a two-delay-line duty cycle adjuster in accordance with an embodiment of the present invention.

FIG. 3 is a schematic of a two-delay-line duty cycle adjuster 300 in accordance with an embodiment of the present invention. In the three-delay-line duty cycle adjuster 200 of FIG. 2, the CKS is either CKR or CKF, depending on whether Tr is greater or less than Tf. Therefore, to optimize the three-delay-line duty cycle adjuster 200, the programmable delay line MAX of FIG. 2 can be eliminated, and the signals CKR and CKF can be directly used to generate CKS. The two-delay-line duty cycle adjuster 300 can include a programmable delay line Tr 302, a programmable delay line Tf 304, a logic comparator, a static mux, a fixed delay Tc 306, and a selecting circuit, such as a dynamic mux 308.

The programmable delay line Tr 302 can have an input CKI, an output CKR, and a delay of Tr. The programmable delay line Tf 304 can have the input CKI, an output CKF, and a delay of Tf. Based on the comparison result of Tr and Tf, either CKR or CKF can be chosen to be CKS. When Tr≥Tf, the select signal sel to the static mux is 0, CKS can equal CKR. When Tr<Tf, sel is 1, and CKR can equal CKF. Once Tr and Tf are decided, sel does not change, and that is why the mux it controls is called a "static" mux. The programmable delay line Tr 302 and programmable delay line Tf 304 can be programmable up to $\alpha T$ delay, where $\alpha$ is the duty cycle correction range and T is the clock period. The delay of Tr and Tf can be configured in accordance with the duty cycle distortions detected by the duty cycle detector. For example, if we plan to correct ±3% duty cycle distortion, $\alpha$ can be set to 0.03. The programmable delay line Tr 302 and programmable delay line Tf 304 can be programmed, such that the delay of Tr and Tf can equal 0.03T. The programmable delay line Tr 302 can adjust the rise edge of CKO through the CKR path, and the programmable delay line Tf 304 can adjust the fall edge of CKO through the CKF path. The delay of Tr and Tf can be programmed to different values if it is necessary.

The output CKS can be further delayed by the fixed delay Tc 306 to generate a select signal CKD, wherein the select signal CKD can control the dynamic mux 308 to dynamically select either CKR or CKF as the output CKO. Contrary to the static mux, the select control CKD of the dynamic mux 308 can keep toggling in accordance with the CKR or CKF. The output CKO can equal to the CKF when the select signal CKD is 1, and equal to the CKR when the select signal CKD is 0. The fixed delay Tc 306 can provide a safe timing margin such that when the select signal "s" of the dynamic mux 308 switches, the inputs CKR and CKF thereof are always valid signals. The dynamic mux 308 can synthesize the rise edges of output clock CKO from the CKR and fall edges of CKF from the CKF.

It has been discovered that, the two-delay-line duty cycle adjuster disclosed in the embodiment of the present invention, has programmable delay line can be adjusted for supplement of various delay in accordance with the duty cycle distortion, to minimize the programmable delay line necessary for adjusting the duty cycle. Therefore, a shorter programmable delay line can result in smaller circuit area, less jitters, and shorter settling time, for a more reliable circuitry and better performance. The smaller circuit area can also be more flexible for physical design, such as shorter routing and more placing options, which may contribute to performance improvement.

Figure 4:
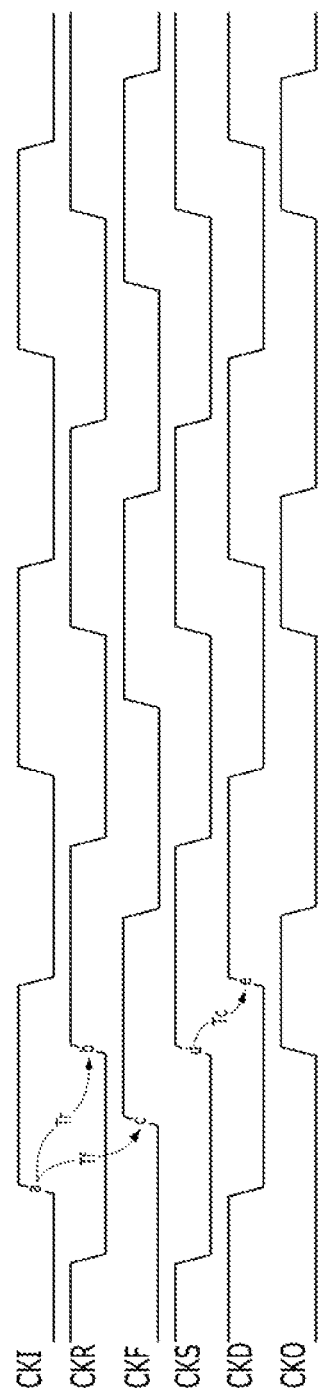
FIG. 4 is a timing diagram of the three-delay-line duty cycle adjuster of FIG. 2 and the two-delay-line duty cycle adjuster of FIG. 3, when Tr is greater than Tf.

FIG. 4 is a timing diagram of the three-delay-line duty cycle adjuster 200 of FIG. 2 and the two-delay-line duty cycle adjuster 300 of FIG. 3, when Tr is greater than Tf. To better understand the above described three-delay-line duty cycle adjuster 200 and two-delay-line duty cycle adjuster 300, the timing diagram is illustrated in the situation when Tr>Tf. When Tr>Tf, the signal sel is 0, CKS can equal to CKR. The mux select signal CKD is a delayed version of CKS with a small fixed delay Tc. The CKO has its rise edge aligned with the rise edge of CKR, and fall edge aligned with the subsequence fall edge of CKF. When Tr>Tf, the rise edge is pushed more to the right side than the fall edge is. As a result, the duty cycle of CKO is less than that of the original input CKI. If we want to increase the duty cycle of CKO, we can configure the programmable delay lines to decrease the delay of Tr or increase the delay of Tf.

Figure 5:
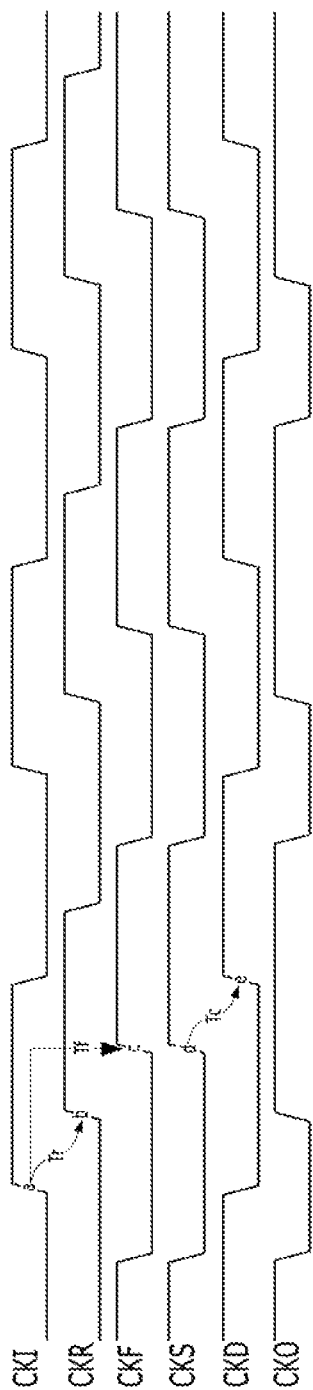
FIG. 5 is a timing diagram of the three-delay-line duty cycle adjuster of FIG. 2 and the two-delay-line duty cycle adjuster of FIG. 3, when Tr is less than Tf.

FIG. 5 is a timing diagram of the three-delay-line duty cycle adjuster 200 of FIG. 2 and the two-delay-line duty cycle adjuster 300 of FIG. 3, when Tr is less than Tf. To better understand the above described three-delay-line duty cycle adjuster 200 and two-delay-line duty cycle adjuster 300, the timing diagram is illustrated in the situation when Tr<Tf. When Tr<Tf, the signal sel is 1, CKS is equal to CKF. The mux select signal CKD is a delayed version of CKS with a small fixed delay Tc. The output CKO has its rise edge aligned with the rise edge of CKR, and fall edge aligned with the subsequence fall edge of CKF. Because CKF is pushed more to the right side than CKR is, the output CKO has a larger duty cycle than the original input CKI. In conclusion, if we want to decrease the duty cycle of CKO, we can configure the programmable delay lines to increase the delay of Tr or decrease delay of Tf.

Figure 6:
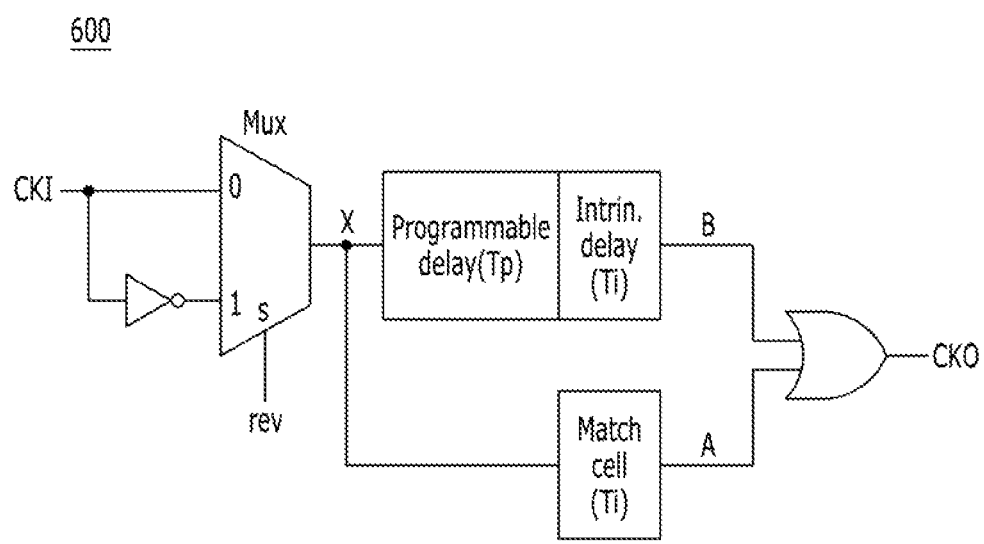
FIG. 6 is a schematic of a one-delay-line duty cycle adjuster in accordance with an embodiment of the present invention.

FIG. 6 is a schematic of a one-delay-line duty cycle adjuster 600 in accordance with an embodiment of the present invention. When we have known whether the duty cycle of CKI is less or more than 50% (with a duty cycle detector), we can further optimize the duty cycle adjuster to be a one-delay-line duty cycle adjuster 600, as shown in FIG. 6, to achieve the goal of ideal 50% duty cycle of CKO. The one-delay-line duty cycle adjuster 600 can include a mux, a programmable delay line containing both the programmable delay Tp and the intrinsic delay Ti, a match cell, and a selecting circuit, such as an OR gate.

To be specific, if CKI's duty cycle is less than 50%, the select signal rev is set to 0, and the node X can equal to CKI. Thus, the duty cycle of the node X is less than 50%. If CKI's duty cycle is larger than 50%, rev is set to 1. The node X can equal to an inverted CKI, wherein the inverted CKI duty cycle is less than 50%. Regardless of the duty cycle of CKI, the duty cycle of the node X is always less than 50%. To bring CKO's duty cycle back to the ideal 50%, conceptually we only need to delay the fall edge of node X without processing the rise edge thereof. Therefore, we only need one degree of freedom and one programmable delay line.

In FIG. 6, rise edge of node A can be earlier than the rise edge of node B, since the delay of node B of Tp+Ti is longer than the delay of the node A of Ti, from the node X. The match cell is used to cancel out intrinsic delay Ti, thus the delay from the node A to node B can be Tp. With the OR gate, the duty cycle of CKO can be extended from the rise edge of the node A to the subsequence fall edge of the node B. By properly configuring the programmable delay Tp, the duty cycle of CKO may be adjusted to ideal 50%.

It has been discovered that, the one-delay-line duty cycle adjuster disclosed in the embodiment of the present invention, has programmable delay line can be adjusted for supplement of various delay in accordance with the duty cycle distortion, to minimize the programmable delay line necessary for adjusting the duty cycle. Therefore, a shorter programmable delay line can result in smaller circuit area, less jitters, and shorter settling time, for a more reliable circuitry and better performance. The smaller circuit area can also be more flexible for physical design, such as shorter routing and more placing options, which may contribute to performance improvement.

Figure 7:
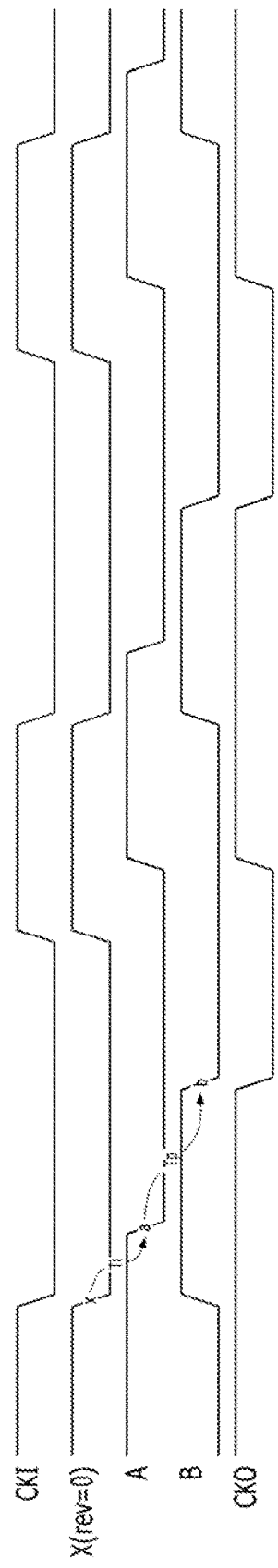
FIG. 7 is a timing diagram of the one-delay-line duty cycle adjuster of FIG. 6, when CKI's duty cycle is less than 50%.

FIG. 7 is a timing diagram of the one-delay-line duty cycle adjuster 600 of FIG. 6, when CKI's duty cycle is less than 50%. In FIG. 7, rev is set to 0, the node X equals to CKI. The node A equals CKI with the delay of Ti, while the node B equals CKI with the delay of Ti+Tp. CKO is the output of the OR gate, and the node A and the node B are the inputs thereof. Therefore, CKO can extend from the rise edge of the node A to the subsequence fall edge of the node B.

Figure 8:
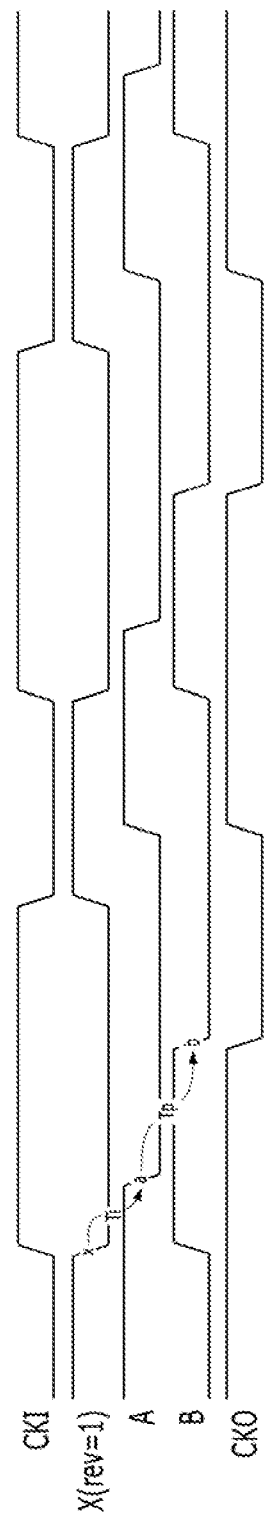
FIG. 8 is a timing diagram of the one-delay-line duty cycle adjuster of FIG. 6, when CKI's duty cycle is greater than 50%.

FIG. 8 is a timing diagram of the one-delay-line duty cycle adjuster 600 of FIG. 6, when CKI's duty cycle is greater than 50%. In FIG. 8, rev is set to 1, and the node X equals to the inverted CKI, wherein the inverted CKI has a duty cycle less than 50%. Thus, the duty cycle of the node X is less than 50%. The node A equals the inverted CKI with the delay Ti, while the node B equals the inverted CKI with the delay Ti+Tp. CKO is the output of the OR gate, and the node A and the node B are the inputs thereof. Therefore, CKO can extend from the rise edge of the node A to the fall edge of the node B.

All designs described in the above embodiments of the present invention, such as the three-delay-line version, the two-delay-line version, and the one-delay-line version, though adequate for most applications, have a common limitation: the two clocks before the dynamic mux, such as CKR and CKF of FIG. 2 and FIG. 3, or before the OR gate, such as the node B and node A of FIG. 6, should have an overlapped section at logic high (1) to avoid any discontinuous waveform or any glitch at CKO. This limitation sets a lower bound request for input clock CKI's duty cycle. For example, if the target CKO duty cycle after adjustment is 50%, the CKI duty cycle must be no less than 25% to prevent any glitch or waveform discontinuation of CKO.

Figure 9:
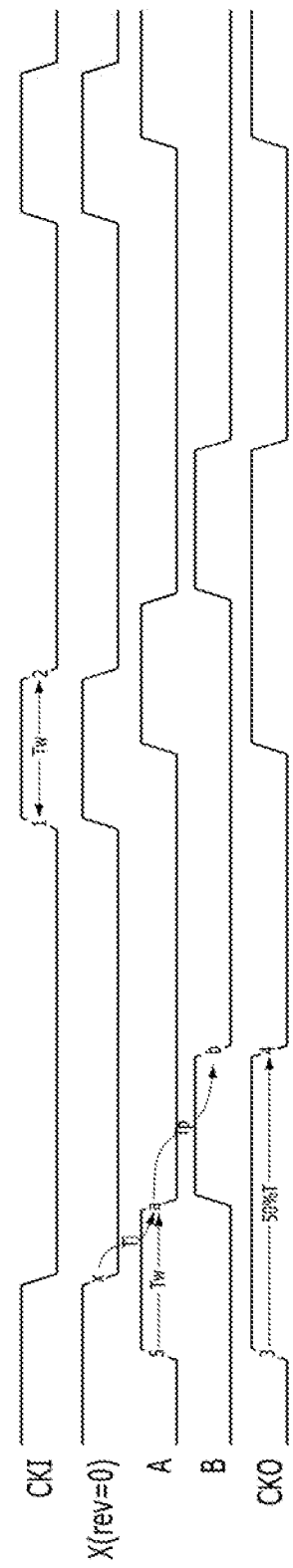
FIG. 9 is a timing diagram of the one-delay-line duty cycle adjuster of FIG. 6, when CKI's duty cycle is 25%.

FIG. 9 is a timing diagram of the one-delay-line duty cycle adjuster 600 of FIG. 6, when CKI's duty cycle is 25%. FIG. 9 shows the boundary condition for the one-delay-line duty cycle adjuster 600, to create the output CKO with continuous waveform or no glitch. FIG. 6 shows an input CKI having a duty cycle less than 50%, with rev as 0. Ideally, the node X can equal to the CKI, CKR at the node A can equal to the CKI with the delay of Ti, and CKF at the node B can equal to CKI with the delay of Ti+Tp. Therefore, the clock skew between CKR at the node A and CKF at the node B can be the programmable delay Tp, which is Ti+T−Ti=Tp. Clocks at node A and B, such as CKR and CKF, respectively, are about to leave their overlapped area, because the fall edge of CKR is aligned with the rise edge of CKF. In such condition, $$Tw+Tp=\text{target } CKO \text{ pulse width}=50\% \ T$$

Thus, Tw=Tp, because the node A and node B are delayed replicas, where Tw is the duty cycle of CKR at the node A. Therefore, Tw=25% T, which means the duty cycle of CKI is 25% in this boundary condition. The same boundary condition can be shown in a similar way for the three-delay-line and two-delay-line versions, too.

Since the target clock CKO duty cycle, from the rise edge of CKR to the subsequence fall edge of CKF, is 50%, a gap can be presented between the fall edge of CKR and the rise edge of CKF. The gap can result in a glitch or discontinuous waveform. Therefore, the boundary condition can be set when the duty cycle of CKI is 25% or Tw is 25% T, to guarantee a continuous waveform with no glitch.

Figure 10:
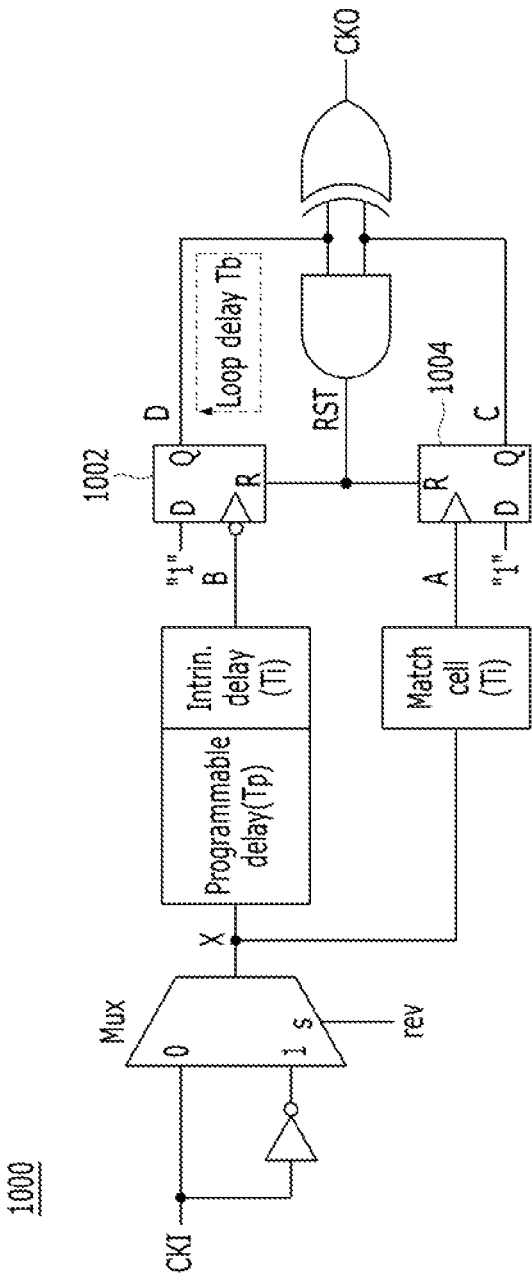
FIG. 10 is a schematic of an edge-triggered one-delay-line duty cycle adjuster in accordance with an embodiment of the present invention.

FIG. 10 is a schematic of an edge-triggered one-delay-line duty cycle adjuster 1000 in accordance with an embodiment of the present invention. To eliminate the limitation of 25% CKI duty cycle and to make the duty cycle adjuster workable in a wider range of CKI duty cycle, an edge-triggered one-delay-line duty cycle adjuster 1000 is shown in FIG. 10. Edge-triggered one-delay-line duty cycle adjuster 1000 can include a mux, a programmable delay with a delay of Tp, an intrinsic delay with a delay of Ti, a match cell with the delay of Ti, and a selecting circuit, such as a negative flip flop 1002, a positive flip flop 1004, an AND gate, and a XOR gate.

Similar to the one-delay-line version in FIG. 6, the mux select control rev can be set to 0 if the CKI duty cycle is smaller than 50%, and set to 1 if the CKI duty cycle is larger than 50%. The knowledge of CKI duty cycle can be provided by the duty cycle detector, available in a complete duty cycle correction loop. Thus, the duty cycle of the clock at node X can have a pulse width Tw always no more than 50%. To bring CKO back to the ideal 50% duty cycle, we only need one degree of freedom and one programmable delay.

The programmable delay line can include the programmable delay, the intrinsic delay, and the match cell used to cancel the intrinsic delay of Ti. The OR gate in FIG. 6 is replaced with a circuitry of two D flip flops, the negative flip flop 1002 and the positive flip flop 1004, and the AND gate. The said circuitry is similar to the phase-frequency detector (PFD) often used in the phase locked loop (PLL). However, the only difference is that, in the edge-triggered one-delay-line duty cycle adjuster 1000, one of the D flip flops is negative triggered, such as the negative flip flop 1002, and one of the D flip flops is positive triggered, such as the positive flip flop 1004, while the typical PFD has both flip flops triggered at the same edge.

In FIG. 10, the positive flip flop 1004 is triggered by the rise edge of the node A, and the negative flip flop 1002 is triggered by the fall edge of the node B. Both the positive flip flop 1004 and the negative flip flop 1002 have inputs "D" connected to a constant 1, inputs "R" connected to a reset signal RST, and outputs "Q" connected to inputs of the AND gate and the inputs of the XOR gate. The output of the AND gate can be the reset signal RST feeding back to the inputs "R" to reset the both flip flops. CKO is the output of the XOR gate, wherein the CKO can have a rise edge aligned with the rise edge of the node C and a fall edge aligned with the subsequence rise edge of the node D. By properly configuring the programmable delay Tp, the fall edge of the CKO can be adjusted to achieve a 50% CKO duty cycle.

By introducing edge triggered flip flops into duty cycle adjusters presented in the embodiments of the present invention, the output CKO can toggle at the rise edge or fall edge of internal clocks. Thus, even though the input clock has a duty cycle less than 25%, or the internal clocks do not have overlapped regions of high, the duty cycle adjuster can still function properly to adjust the input clock duty cycle to desired target value.

It has been discovered that, the edge-triggered one-delay-line duty cycle adjuster disclosed in the embodiment of the present invention, has programmable delay line can be adjusted for supplement of various delay in accordance with the duty cycle distortion, to minimize the programmable delay line necessary for adjusting the duty cycle. Therefore, a shorter programmable delay line can result in smaller circuit area, less jitters, and shorter settling time, for a more reliable circuitry and better performance. The smaller circuit area can also be more flexible for physical design, such as shorter routing and more placing options, which may contribute to performance improvement.

Figure 11:
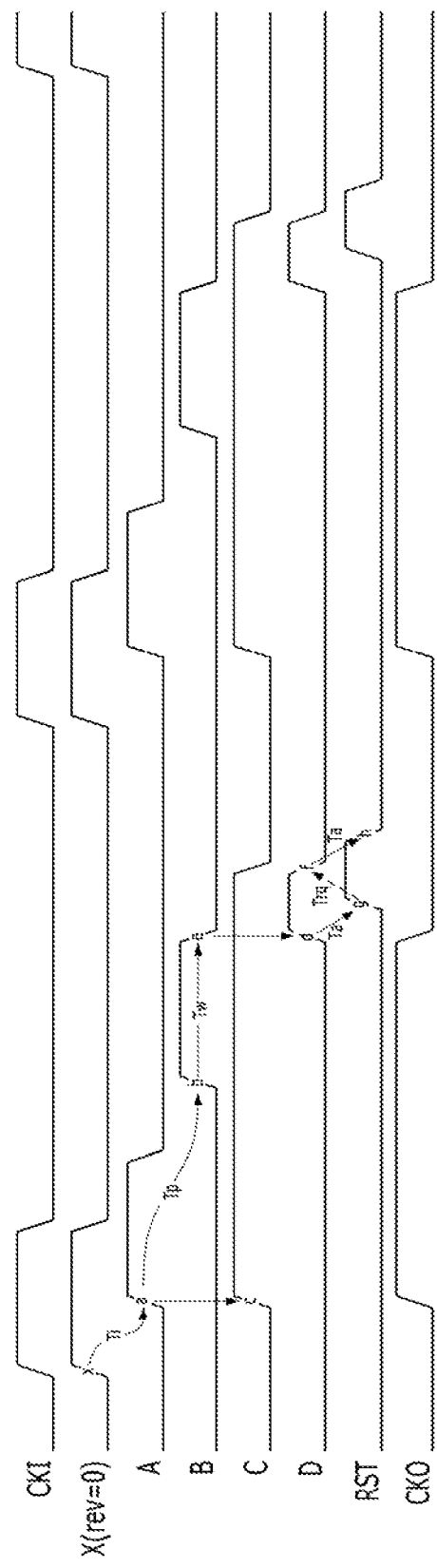
FIG. 11 is a timing diagram of the edge-triggered one-delay-line duty cycle adjuster of FIG. 10, when CKI's duty cycle is less than 50%.

FIG. 11 is a timing diagram of the edge-triggered one-delay-line duty cycle adjuster 1000 of FIG. 10, when CKI's duty cycle is less than 50%. As shown in the timing diagram of FIG. 11, input clock CKI's duty cycle is less than 50%, rev=0, and all of the nodes A, B, C, D and RST are set to 0's initially. The node X can equal to CKI when rev=0. Since the node A's delay of Ti is shorter than the node B's delay of Ti+Tp, the node A can rise earlier than the node B. After the match cell delay of Ti, the node A rises. The node C, which is the output of the positive flip flop 1004, can toggle to 1 at the rise edge of the node A, and stay high until next rise edge of the node A or being reset by RST. The node B can be delayed by the programmable delay of Tp and intrinsic delay of Ti. The delay between the node A and the node B can be Tp=Tp+Ti−Ti. When the node B falls, the node D at the output of the negative flip flop 1002 can toggle to 1, and stay high until next fall edge of the node B or being reset by RST. When both the node C and node D are high, RST or the AND gate output can become high after a gate delay of Ta. Then the positive flip flop 1004 outputs C and the negative flip flop 1002 output D can be reset to 0's after a reset-to-Q delay of Trq. The loop delay of Tb=Ta+Trq, can be further prolonged by inserting an optional fixed delay element (not shown) if required for the timing purpose. The pulse widths of the node D and reset signal RST can be determined by the loop delay Tb.

Since CKO is activated by the rise edge of the node A and deactivated by the fall edge of the node B, the pulse width of the node C can be (Tp+Tw+Ta+Trq)=(Tp+Tw+Tb), which can be programmed by Tp. To verify if the node C can be used as the final output, we set Tp=0. Ideally, when Tp=0, the final output of the duty cycle adjuster should have the same pulse width Tw as the input CKI does. But the pulse width of the node C is now (Tw+Tb), with the fixed loop delay of Tb. To eliminate the loop delay of Tb, the XOR gate is added after the node C and the node D to generate the final output CKO, which has the desired pulse width (Tp+Tw).

Figure 12:
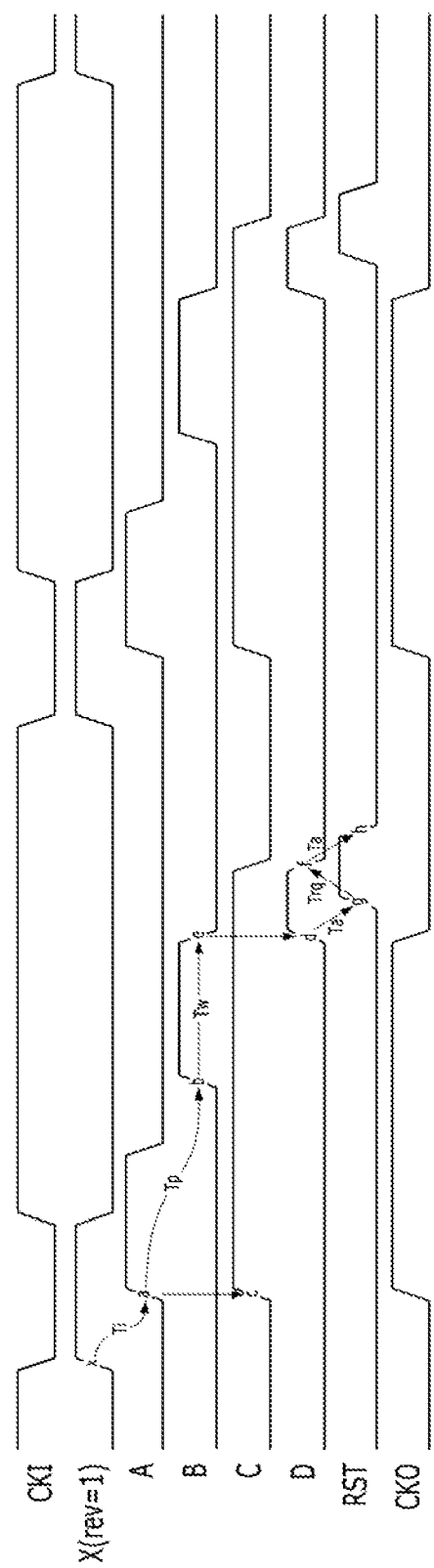
FIG. 12 is a timing diagram of the edge-triggered one-delay-line duty cycle adjuster of FIG. 10, when CKI's duty cycle is greater than 50%.

FIG. 12 is a timing diagram of the edge-triggered one-delay-line duty cycle adjuster 1000 of FIG. 10, when CKI's duty cycle is greater than 50%. As shown in the timing diagram FIG. 12, input clock CKI's duty cycle is greater than 50%, rev=1, initially all of A, B, C, D and RST are set to 0's. The node X can equal to an inverted CKI, wherein the inverted CKI has a duty cycle less than 50%. After the match cell delay of Ti, the node A rises. The node C at the output of the positive flip flop 1004 can toggle to 1, and stay high until next rise edge of the node A or being reset by RST. The node B can be delayed by the programmable delay of Tp and intrinsic delay of Ti. The delay between the node A and the node B can be Tp=Tp+Ti−Ti. When the node B falls, the node D at the output of the negative flip flop 1002 can toggle to 1, and stay high until next fall edge of the node B or being reset by RST. When both the node C and node D are high, the AND gate output RST can become high after a gate delay of Ta. Then both the positive flip flop 1004 outputs C and the negative flip flop 1002 output D can be reset to 0's after a reset-to-Q delay of Trq. The loop delay of Tb=Ta+Trq, can be further prolonged by inserting an optional fixed delay element (not shown) if required for the timing purpose. The pulse widths of the node D and reset signal RST can be determined by the loop delay Tb.

Since CKO is activated by the rise edge of the node A and deactivated by the fall edge of the node B, the pulse width of the node C can be (Tp+Tw+Ta+Trq)=(Tp+Tw+Tb), which can be programmed by Tp. To verify if the node C can be used as the final output, we set Tp=0. Ideally, when Tp=0, the final output of the duty cycle adjuster should have the same pulse width Tw as the inverted CKI does. But the pulse width of the node C is now (Tw+Tb), with the fixed loop delay of Tb. To eliminate the loop delay of Tb, the XOR gate is added after the node C and the node D to generate the final output CKO, which has the desired pulse width (Tp+Tw).

From the observation, even though the logic highs of the node A and the node B are not overlapped, the CKO waveform has no glitch caused by the non-overlap regions and is a continuous waveform. Therefore, as the duty cycle of CKI approaches the theoretical limitation of zero, the edge-triggered one-delay-line duty cycle adjuster 1000 in FIG. 10 can still adjust the CKO duty cycle to the desired value. The edge-triggered one-delay-line duty cycle adjuster 1000 can successfully extend the correctable duty cycle of the input CKI from 25% to ~0%. Noticeably, the node C and node D can fall at the same time. To prevent any timing skew there between and to avoid any glitches at the XOR output, delicate layout routings of the reset signal RST, the node C, and the node D are required for implementation.

Figure 13:
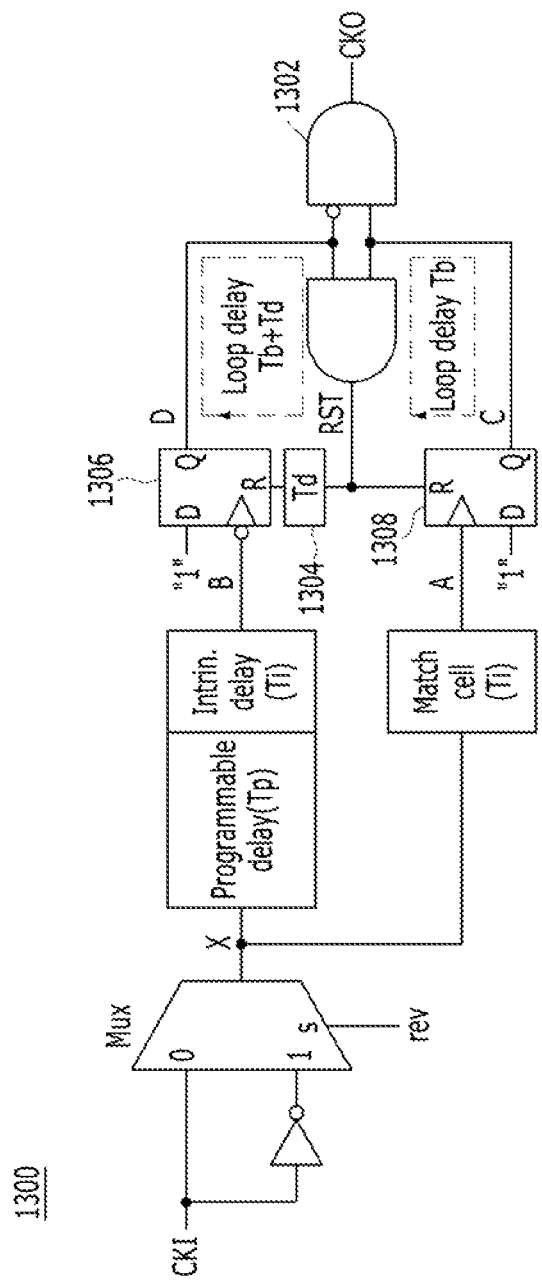
FIG. 13 is a schematic of a glitch-free edge-triggered one-delay-line duty cycle adjuster in accordance with an embodiment of the present invention.

FIG. 13 is a schematic of a glitch-free edge-triggered one-delay-line duty cycle adjuster 1300 in accordance with an embodiment of the present invention. To achieve the glitch-free design not relying heavily on the delicate layout routing techniques, a glitch-free edge-triggered one-delay-line duty cycle adjuster 1300 in shown in FIG. 13. The XOR gate of the edge-triggered one-delay-line duty cycle adjuster 1000 in FIG. 10, is replaced by an AND gate 1302 with one inverted input. A fixed delay Td 1304 is inserted in front of the reset pin of the negative-triggered flip flop, such as the negative flip flop 1306. The output "Q" of the negative flip flop 1306 is connected to the inverted input of the AND gate 1302.

The basic idea is to delay the fall edge of the node D by Td. Thus, both of the node C and the node D's transition edges cannot be overlapped or aligned, and glitches can be avoided. RST can reset the node D to 0, with the delay of Td after the node C is reset to 0. Therefore, racing condition of both the node D and node C falling at same time in the edge-triggered one-delay-line duty cycle adjuster 1000 can be prevented, resulting in a glitch free output CKO. The AND gate 1302 only generates logic ones when the node C=1 and the node D=0. Thus, CKO has the desired pulse width of (Tp+Tw) without any glitch. The detailed timing diagrams are shown in FIG. 14 and FIG. 15.

It has been discovered that, the glitch-free edge-triggered one-delay-line duty cycle adjuster disclosed in the embodiment of the present invention, has programmable delay line can be adjusted for supplement of various delay in accordance with the duty cycle distortion, to minimize the programmable delay line necessary for adjusting the duty cycle. Therefore, a shorter programmable delay line can result in smaller circuit area, less jitters, and shorter settling time, for a more reliable circuitry and better performance. The smaller circuit area can also be more flexible for physical design, such as shorter routing and more placing options, which may contribute to performance improvement.

Figure 14:
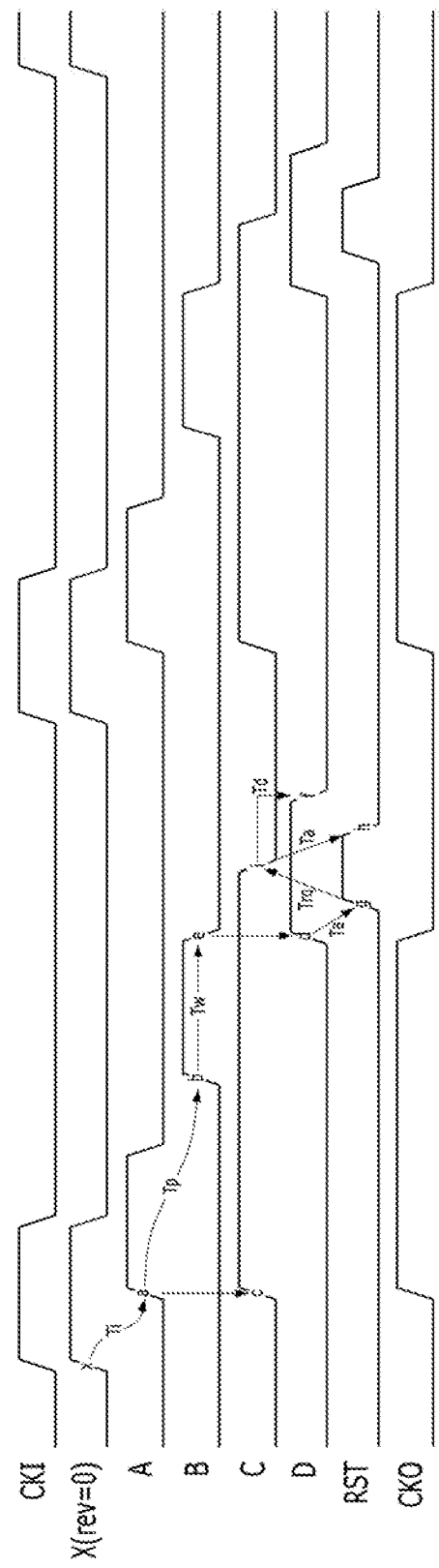
FIG. 14 is a timing diagram of the glitch-free edge-triggered one-delay-line duty cycle adjuster of FIG. 13, when CKI's duty cycle is less than 50%.

FIG. 14 is a timing diagram of the glitch-free edge-triggered one-delay-line duty cycle adjuster 1300 of FIG. 13, when CKI's duty cycle is less than 50%. The rev is set to 0, and the node X can equal to the input CKI, wherein the node X has a duty cycle less than 50%.

Figure 15:
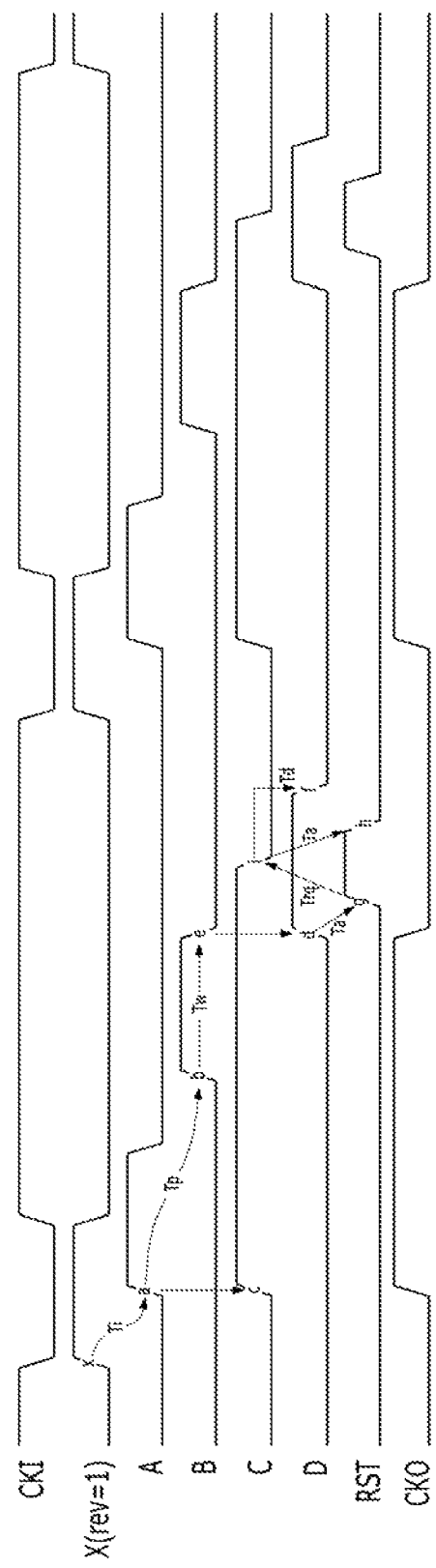
FIG. 15 is a timing diagram of the glitch-free edge-triggered one-delay-line duty cycle adjuster of FIG. 13, when CKI's duty cycle is greater than 50%.

FIG. 15 is a timing diagram of the glitch-free edge-triggered one-delay-line duty cycle adjuster of FIG. 13, when CKI's duty cycle is greater than 50%. The rev is set to 1, and the node X can equal to the inverted CKI, wherein the inverted CKI has a duty cycle less than 50%. Thus, the node X can still have a duty cycle less than 50%.

In Both FIG. 14 and FIG. 15, the reset signal RST can reset the node C to 0 after a loop delay of Tb, and reset the node D to 0 after a loop delay of Tb+Td. Since the reset to the negative flip flop 1306 has additional delay of Td than to the positive flip flop 1308, the fall edge of the node D can have a delay of Td after the fall edge of the node C. The skew between the fall edges of the node C and the node D can eliminate the racing condition there between, and prevent the glitch of the output CKO.

Both the edge-triggered one-delay-line duty cycle adjuster 1000 in FIG. 10 and the glitch-free edge-triggered one-delay-line duty cycle adjuster 1300 in FIG. 13 require that the node C rises before the node D does, because the pulse width of CKO is defined by the right sequence of the two rise edges. Thus, we need to ensure that, after the edge-triggered duty cycle adjuster is powered up, the positive-triggered flip flop, such as the positive flip flop 1004 of FIG. 10 or the positive flip flop 1308 of FIG. 13, is always triggered by the rise edge of the node A, before the negative-triggered flip flop, such as the negative flip flop 1002 of FIG. 10 or the negative flip flop 1306 of FIG. 13, is triggered by the fall edge of the node B. The output CKO can be glitch free under the right sequence.

Figure 16:
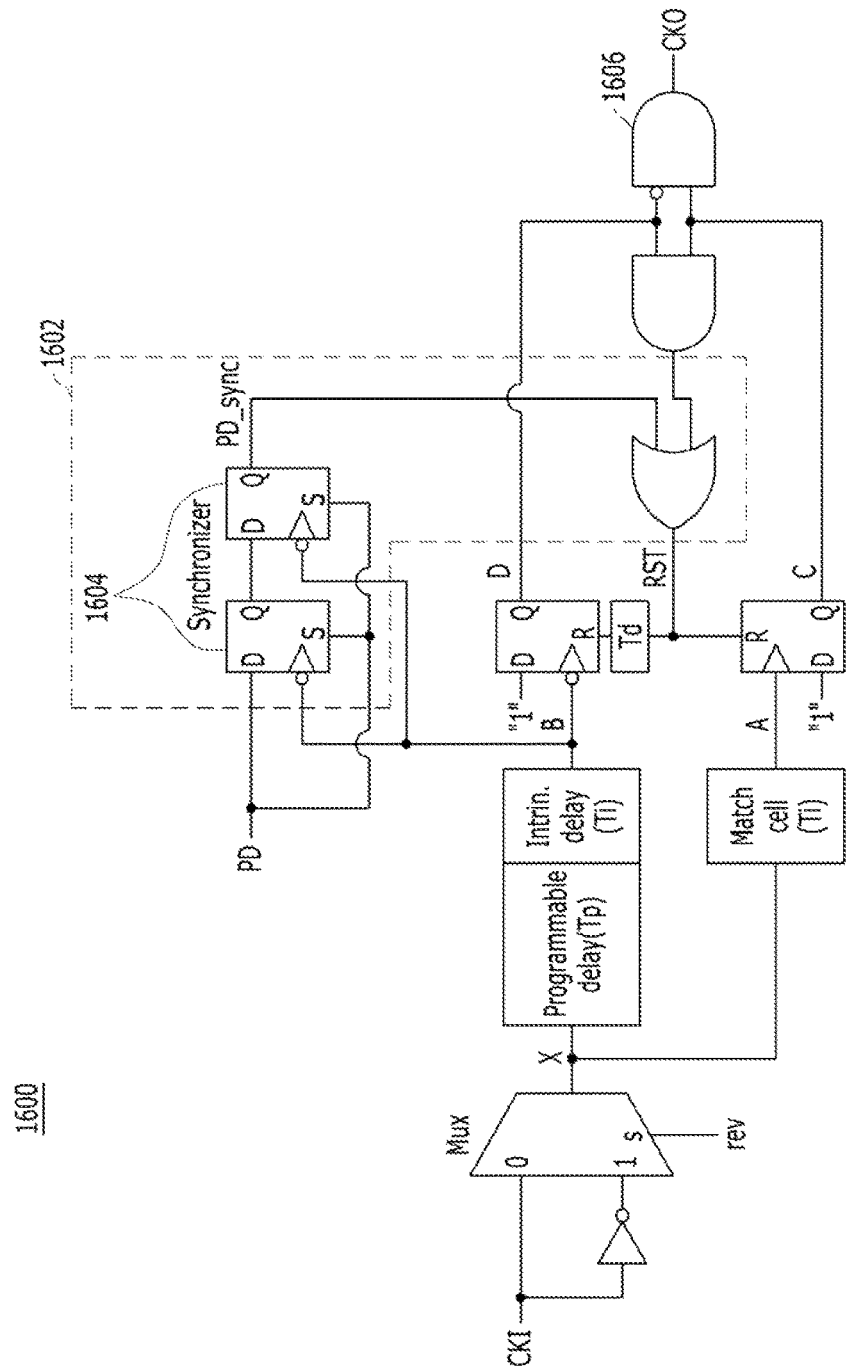
FIG. 16 is a schematic of a glitch-free edge-triggered duty cycle adjuster with a power-up sequencer in accordance with an embodiment of the present invention.

FIG. 16 is a schematic of a glitch-free edge-triggered one-delay-line duty cycle adjuster 1600 with a power-up sequencer in an embodiment of the present invention. FIG. 16 shows the glitch-free edge-triggered one-delay-line duty cycle adjuster 1600 with a power-up sequencer 1602. The same power-up sequencer can be employed by the other edge-triggered duty cycle adjuster designs as well. The power-up sequencer 1602 can comprise a synchronizer including two negative-triggered flip flops 1604 (with a set pin "S") and an OR gate. The two negative-triggered flip flops 1604 of the synchronizer can convert an asynchronous power-down signal PD into a synchronized PD_sync. The synchronized PD_sync can be input to the OR gate to set the RST to 1 for resetting the node C and the node D to 0 after the loop delays, respectively.

Initially the node C and node D are reset to 0, because the PD_sync and RST are is at power down when PD is high. When the PD goes low for powering on the duty cycle adjuster, the fall edge of PD_sync is toggled at the fall edge of the node B in accordance with PD, because PD_sync is negative-triggered by the node B. Set pins "s" of the negative-triggered flip flops 1604 are connected to PD. Thus, the PD_sync can be pulled high immediately when PD pulls high. When PD=0, after two clock cycles, PD_sync=0 and RST=0, and the glitch-free edge-triggered one-delay-line duty cycle adjuster 1600 is powered up. The node C can toggle at rise edge of the node A, and the node D can toggle at fall edge of the node B. The node C and the node D can be inputs to an AND gate 1606 with an inverted input, and the combination logic circuitry to control RST. The output of the AND gate 1606 is the output CKO.

The power-up sequencer 1602 can guarantee the duty cycle adjusters of the embodiments of the present invention follow a proper power down and power up sequences. Therefore, the duty cycle adjusters can meet the requirement that the node C rises before the node D does, for generating CKO with the desired pulse width.

It has been discovered that, the glitch-free edge-triggered duty cycle adjuster with a power-up sequencer disclosed in the embodiment of the present invention, has programmable delay line can be adjusted for supplement of various delay in accordance with the duty cycle distortion, to minimize the programmable delay line necessary for adjusting the duty cycle. Therefore, a shorter programmable delay line can result in smaller circuit area, less jitters, and shorter settling time, for a more reliable circuitry and better performance. The smaller circuit area can also be more flexible for physical design, such as shorter routing and more placing options, which may contribute to performance improvement.

Figure 17:
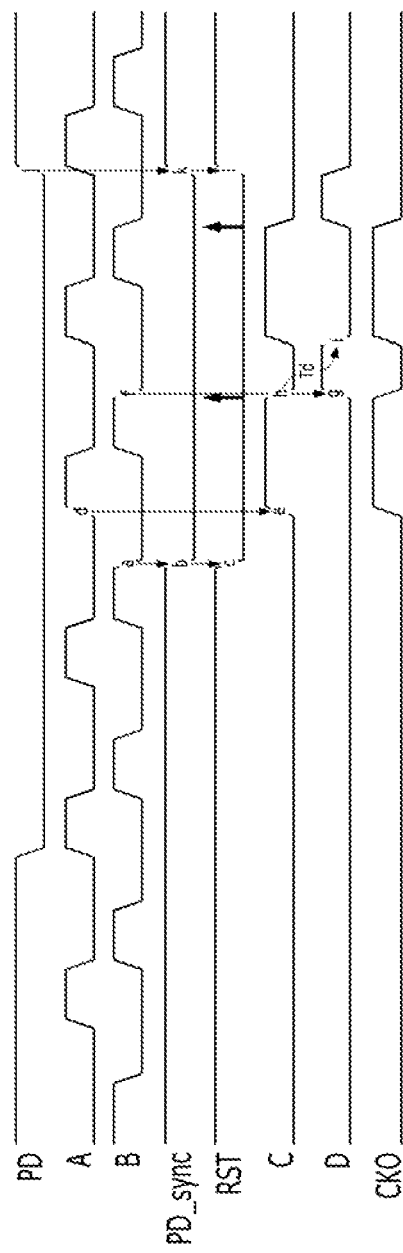
FIG. 17 is a timing diagram of the glitch-free edge-triggered one-delay-line duty cycle adjuster with a power-up sequencer of FIG. 16.

FIG. 17 is a timing diagram of the glitch-free edge-triggered one-delay-line duty cycle adjuster 1600 with a power-up sequencer 1602 of FIG. 16. As shown in the timing diagram in FIG. 17, PD is high before the glitch-free edge-triggered one-delay-line duty cycle adjuster 1600 is powered up, and the node C and node D are inactive. To power up the glitch-free edge-triggered one-delay-line duty cycle adjuster 1600, the asynchronous PD needs to go low. The first edge after PD_sync goes low can be the rise edge of the node A which can trigger the rise edge of the node C. The next edge can be the fall edge of the node B that can trigger the rise edge of the node D. PD_sync can pull down the reset signal RST to active the flip flops after two fall edges of the node B. Thus the node C can toggle at the rise edge of the node A, and the node D can toggle at the fall edge of the node B. The node C and the node D can be the inputs of the AND gate, where the output thereof can be CKO. With this arrangement, the output CKO can have a correct pulse width following the correct power up sequence. To power down the duty cycle adjuster, PD_sync is set to 1 as soon as PD rises, and then RST becomes 1 to reset the node C and the node D to 0.

Figure 18:
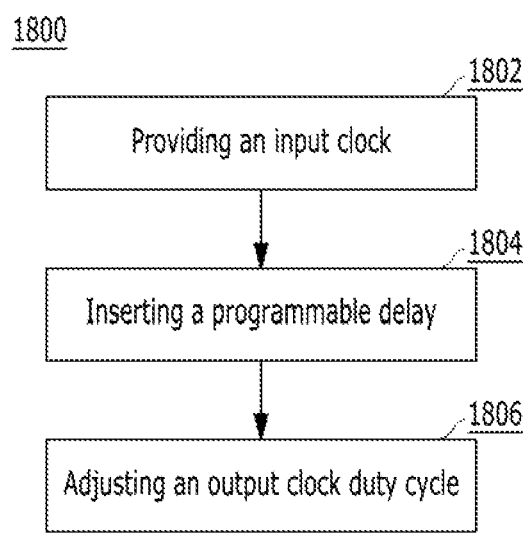
FIG. 18 is a flow chart of a method of operation of an efficient digital duty cycle adjuster in accordance with a further embodiment of the present invention.

FIG. 18 is a flow chart of a method 1800 of operation of an efficient digital duty cycle adjuster in accordance with a further embodiment of the present invention. The method 1800 of adjusting duty cycle comprising: providing an input clock having an input clock duty cycle in a block 1802; inserting at least one programmable delay of a programmable delay line to the input clock, the input clock has a first delay inserted for a delayed rise edge, and a second delay inserted for a delayed fall edge, wherein the first delay, the second delay, or the combination thereof, includes the programmable delay in a block of 1804; and adjusting an output clock duty cycle of an output clock by configuring the programmable delay, the output clock is generated by a selecting circuit, the selecting circuit includes a select signal, and the select signal is determined in accordance with the first delay and the second delay in a block of 1806.

In summary, using the proposed designs in the embodiments of the present invention, the benefits can include smaller circuitry area, less clock jitter, and shorter settling (calibration) time when they are used in a complete duty cycle correction loop. A smaller duty cycle adjuster can make physical design, such as place and route, easier, and can help shrink chip size. Less clock jitter and shorter settling time can improve circuit reliability and performance.

The proposed duty cycle adjusters provided in the embodiments of the present invention have different basic principles. The prior art adjusts only the fall edges of CKO. With one degree of freedom, without the prior knowledge of CKI duty cycle, the programmable delay line needs to cover 0.5T delay. In our designs, either with two degrees of freedom, or one degree of freedom plus the prior knowledge of CKI duty cycle, all our programmable delay lines are intended to correct only $\alpha T$, where $\alpha$ is the duty cycle distortion coefficient of CKI, and is normally less than ±5% in practice. Due to much shorter programmable delay lines, our proposed duty cycle adjusters have smaller circuitry areas, less output jitter, and shorter calibration time when working with the duty cycle detector in a complete duty cycle correction loop. We provided both level-triggered and edge-triggered solutions. Based on the input distortion range and whether the prior knowledge of input duty cycle (above or below 50%) is available, we can select one of the designs provided in the embodiments of the present invention with the best trade-off of the simplicity and area.

Thus, it has been discovered that the digital duty cycle adjuster of the present invention furnishes important and heretofore unknown and unavailable solutions, capabilities, and functional aspects for interposer systems on integrated circuit clock systems. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus of an efficient digital duty cycle adjuster comprising:
    an input clock having an input clock duty cycle;

at least one programmable delay line inserting a programmable delay to the input clock, wherein the input clock has a first delay inserted for a delayed rise edge, and a second delay inserted for a delayed fall edge, and wherein the first delay, the second delay, or the combination thereof, includes the programmable delay; and a selecting circuit generating an output clock having an output clock duty cycle, wherein the selecting circuit includes a select signal, the select signal is determined in accordance with the first delay and the second delay, the output clock duty cycle is adjusted by the programmable delay, and the output clock has a rise edge aligned with a rise edge of the delayed rise edge and a fall edge aligned with a fall edge of the delayed fall edge.

2. The apparatus of claim 1, wherein the programmable delay is configured in accordance with a duty cycle correct range and a clock period of the input clock.

3. The apparatus of claim 1, wherein the second delay includes the programmable delay and an intrinsic delay, and the first delay includes a match cell delay, and the match cell delay equals the intrinsic delay.

4. The apparatus of claim 1, further comprising a static mux having a static select signal, wherein the static select signal is determined by the input clock duty cycle.

5. The apparatus of claim 4, wherein the static mux includes two inputs, and one input is inverted of the other input.

6. The apparatus of claim 1, wherein the selecting circuit includes edge trigged flip flops trigged at opposite edges, the edge trigged flip flops include a positive flip flop trigged at positive edge and a negative flip flop triggered at negative edge, the delayed rise edge is connected to the clock of the positive flip flop, and the delayed fall edge is connected to the clock of the negative flip flop.

7. The apparatus of claim 6, wherein the selecting circuit includes an AND gate, the outputs of the positive flip flop and the negative flip flop are connected to the inputs of the AND gate, and the output of the AND gate is used to reset the positive flip flop and the negative flip flop.

8. The apparatus of claim 7, further comprising a fixed delay Tb inserted before the reset pin of the negative flip flop.

9. The apparatus of claim 8, wherein the selecting circuit includes an inverted AND gate with an inverted input, the output of the negative flip flop is connected to the inverted input of the inverted AND gate, and the output of the positive flip flop is connected to the other input of the inverted AND gate.

10. The apparatus of claim 8, further comprising a power-up sequencer, wherein the power-up sequencer includes a synchronizer and an OR gate, the output of the synchronizer and the output of the AND gate are connected to the inputs of the OR gate, and the output of the OR gate is used to reset the positive flip flop and the negative flip flop.

11. The apparatus of claim 10, wherein the synchronizer comprises at least 2 sequentially connected negative-triggered flip flops, a power down signal is connected to the input of the synchronizer and the set pins of the negative-triggered flip flops, and the delayed fall edge is connected to the clock pins of the negative-triggered flip flops.

12. The apparatus of claim 6, wherein the selecting circuit includes an XOR gate, and the outputs of the positive flip flop and the negative flip flop are connected to inputs of the XOR gate.

13. The apparatus of claim 1, wherein the selecting circuit includes an OR gate, the delayed first edge and the delay second edge are connected to inputs of the OR gate.

14. The apparatus of claim 1, wherein the output clock duty cycle is different than the input clock duty cycle.

15. An apparatus of an efficient duty cycle adjuster, comprising:

an input clock having an input clock duty cycle;

at least one programmable delay line inserting a programmable delay to the input clock, wherein the input clock has a first delay inserted for a delayed rise edge, and a second delay inserted for a delayed fall edge, and wherein the first delay, the second delay, or the combination thereof, includes the programmable delay; and a selecting circuit generating an output clock having an output clock duty cycle, wherein the selecting circuit includes a select signal, the select signal is determined in accordance with the first delay and the second delay, the output clock duty cycle is adjusted by the programmable delay;

wherein the selecting circuit includes a dynamic mux, and a fixed delay element is inserted before the select signal.

16. A method of operation of an efficient digital duty cycle adjuster comprising:

providing an input clock having an input clock duty cycle;

inserting at least one programmable delay of a programmable delay line to the input clock, wherein the input clock has a first delay inserted for a delayed rise edge, and a second delay inserted for a delayed fall edge, and wherein the first delay, the second delay, or the combination thereof, includes the programmable delay; and adjusting an output clock duty cycle of an output clock by configuring the programmable delay, including aligning a rise edge of the output clock with a rise edge of the delayed rise edge and aligning a fall edge of the output clock with a fall edge of the delayed fall edge, wherein the output clock is generated by a selecting circuit, the selecting circuit includes a select signal, and the select signal is determined in accordance with the first delay and the second delay.

17. The method of claim 16, wherein the inserting the programmable delay includes configuring the programmable delay in accordance with a duty cycle correct range and a clock period of the input clock.

18. The method of claim 16, wherein the inserting the programmable delay of the programmable delay line includes inserting the programmable delay and an intrinsic delay for the second delay, a match cell delay for the first delay, and the match cell delay equals the intrinsic delay.

* * * * *